United States Patent
Verspay et al.

(10) Patent No.: US 9,798,247 B2
(45) Date of Patent: *Oct. 24, 2017

(54) LITHOGRAPHIC APPARATUS AND DEVICE MANUFACTURING METHOD INVOLVING A LIQUID CONFINEMENT STRUCTURE

(71) Applicant: ASML NETHERLANDS B.V., Veldhoven (NL)

(72) Inventors: Jacobus Johannus Leonardus Hendricus Verspay, Thorn (NL); Hans Jansen, Eindhoven (NL); Marco Koert Stavenga, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/488,191

(22) Filed: Apr. 14, 2017

(65) Prior Publication Data

US 2017/0219938 A1    Aug. 3, 2017

Related U.S. Application Data

(63) Continuation of application No. 14/993,810, filed on Jan. 12, 2016, now Pat. No. 9,645,507, which is a continuation of application No. 14/444,833, filed on Jul. 28, 2014, now Pat. No. 9,261,797, which is a continuation of application No. 12/725,883, filed on Mar. 17, 2010, now Pat. No. 8,817,231, which is a continuation of application No. 12/213,426, filed on Jun. 19, 2008, now Pat. No. 7,710,537, which is a continuation of application No. 10/986,185, filed on Nov. 12, 2004, now Pat. No. 7,423,720.

(51) Int. Cl.
*G03F 7/20* (2006.01)

(52) U.S. Cl.
CPC ...... *G03F 7/70341* (2013.01); *G03F 7/70608* (2013.01); *G03F 7/70858* (2013.01)

(58) Field of Classification Search
CPC .................................................. G03F 7/70341
See application file for complete search history.

(56) References Cited

U.S. PATENT DOCUMENTS

| | | |
|---|---|---|
| 3,573,975 A | 4/1971 | Dhaka et al. |
| 3,648,587 A | 3/1972 | Stevens |
| | (Continued) | |

FOREIGN PATENT DOCUMENTS

| | | |
|---|---|---|
| DE | 206 607 | 2/1984 |
| DE | 221 563 | 4/1985 |
| | (Continued) | |

OTHER PUBLICATIONS

M. Switkes et al., "Immersion Lithography at 157 nm", Mit Lincoln Lab, Orlando 2001-1, Dec. 17, 2001.

(Continued)

*Primary Examiner* — Michelle M Iacoletti
(74) *Attorney, Agent, or Firm* — Pillsbury Winthrop Shaw Pittman LLP

(57) ABSTRACT

In an immersion lithography apparatus in which immersion liquid is supplied to a localized space, the space is substantially polygonal in plan substantially parallel to the substrate. In an embodiment, two corners of the space have a radius of curvature no greater than the width of a transition zone between the space configured to contain liquid and a surrounding configured not to contain liquid.

21 Claims, 4 Drawing Sheets

(56) References Cited

U.S. PATENT DOCUMENTS

| | | |
|---|---|---|
| 4,346,164 A | 8/1982 | Tabarelli et al. |
| 4,390,273 A | 6/1983 | Loebach et al. |
| 4,396,705 A | 8/1983 | Akeyama et al. |
| 4,480,910 A | 11/1984 | Takanashi et al. |
| 4,509,852 A | 4/1985 | Tabarelli et al. |
| 5,040,020 A | 8/1991 | Rauschenbach et al. |
| 5,610,683 A | 3/1997 | Takahashi |
| 5,715,039 A | 2/1998 | Fukuda et al. |
| 5,825,043 A | 10/1998 | Suwa |
| 5,900,354 A | 5/1999 | Batchelder |
| 6,191,429 B1 | 2/2001 | Suwa |
| 6,236,634 B1 | 5/2001 | Lee et al. .......... 369/112 |
| 6,560,032 B2 | 5/2003 | Hatano |
| 6,600,547 B2 | 7/2003 | Watson et al. |
| 6,603,130 B1 | 8/2003 | Bisschops et al. |
| 6,633,365 B2 | 10/2003 | Suenaga |
| 6,788,477 B2 | 9/2004 | Lin |
| 6,952,253 B2 | 10/2005 | Lof et al. |
| 6,954,256 B2 | 10/2005 | Flagello et al. |
| 7,349,064 B2 | 3/2008 | Nakano |
| 7,358,507 B2 | 4/2008 | Van Santen |
| 7,367,345 B1 | 5/2008 | Hemker et al. |
| 7,397,532 B2 | 7/2008 | Novak |
| 7,399,978 B2 | 7/2008 | Van Santen et al. |
| 7,423,720 B2 | 9/2008 | Verspay et al. |
| 7,433,019 B2 | 10/2008 | Kiuchi et al. |
| 7,456,930 B2 | 11/2008 | Hazelton et al. |
| 7,514,699 B2 | 4/2009 | Neijzen et al. |
| 7,710,537 B2 | 5/2010 | Verspay et al. |
| 7,749,689 B2 | 7/2010 | Hemker et al. |
| 8,497,973 B2 | 7/2013 | Coon et al. |
| 8,717,533 B2 | 5/2014 | Nagasaka et al. |
| 8,817,231 B2 | 8/2014 | Verspay et al. |
| 2002/0020821 A1 | 2/2002 | Van Santen et al. ......... 250/492 |
| 2002/0163629 A1 | 11/2002 | Switkes et al. |
| 2003/0123040 A1 | 7/2003 | Almogy |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0075895 A1 | 4/2004 | Lin |
| 2004/0109237 A1 | 6/2004 | Epple et al. |
| 2004/0114117 A1 | 6/2004 | Bleeker |
| 2004/0119954 A1 | 6/2004 | Kawashima et al. |
| 2004/0125351 A1 | 7/2004 | Krautschik |
| 2004/0135099 A1 | 7/2004 | Simon et al. |
| 2004/0136494 A1 | 7/2004 | Lof et al. |
| 2004/0160582 A1 | 8/2004 | De Smit et al. |
| 2004/0165159 A1 | 8/2004 | Lof et al. |
| 2004/0207824 A1 | 10/2004 | Lof et al. |
| 2004/0211920 A1 | 10/2004 | Derksen et al. |
| 2004/0263809 A1 | 12/2004 | Nakano |
| 2005/0110973 A1 | 5/2005 | Streefkerk et al. |
| 2005/0132914 A1 | 6/2005 | Mulkens et al. |
| 2005/0134815 A1 | 6/2005 | Van Santen et al. |
| 2005/0153424 A1 | 7/2005 | Coon |
| 2006/0023181 A1 | 2/2006 | Novak |
| 2006/0023183 A1 | 2/2006 | Novak et al. |
| 2006/0152697 A1 | 7/2006 | Poon et al. |
| 2006/0209278 A1 | 9/2006 | Kiuchi et al. |
| 2006/0209414 A1 | 9/2006 | Van Santen et al. |
| 2006/0250593 A1 | 11/2006 | Nishii |
| 2006/0261288 A1 | 11/2006 | Van Santen |
| 2007/0052936 A1 | 3/2007 | Neijzen et al. |
| 2007/0070316 A1 | 3/2007 | Ehrmann et al. |
| 2007/0139628 A1 | 6/2007 | Nagasaka et al. |
| 2007/0146663 A1 | 6/2007 | Nagasaka |
| 2007/0195301 A1 | 8/2007 | Nagasaka |
| 2007/0222957 A1 | 9/2007 | Nagasaka et al. |
| 2008/0030704 A1 | 2/2008 | Novak et al. |
| 2008/0309894 A1 | 12/2008 | Ehrmann et al. |
| 2010/0141912 A1 | 6/2010 | Ehrmann et al. |

FOREIGN PATENT DOCUMENTS

| | | |
|---|---|---|
| DE | 224448 | 7/1985 |
| DE | 242880 | 2/1987 |
| EP | 0 023 231 | 2/1981 |
| EP | 0 418 427 | 3/1991 |
| EP | 1 039 511 | 9/2000 |
| EP | 1 420 300 | 5/2004 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303119 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-506290 | 2/2004 |
| JP | 2004-193252 | 7/2004 |
| JP | 2004-259966 | 9/2004 |
| JP | 2004-356205 | 12/2004 |
| JP | 2005-019864 | 1/2005 |
| JP | 2005-109426 | 4/2005 |
| JP | 2005-183744 | 7/2005 |
| JP | 2005-223315 | 8/2005 |
| JP | 2005-286286 | 10/2005 |
| JP | 2005-347617 | 12/2005 |
| JP | 2005-353820 | 12/2005 |
| JP | 2006-19720 | 1/2006 |
| JP | 2006-510146 | 2/2006 |
| JP | 2006-60016 | 3/2006 |
| JP | 2006-511011 | 3/2006 |
| JP | 2006-511021 | 3/2006 |
| JP | 2006-093721 | 4/2006 |
| JP | 2006-165500 | 6/2006 |
| JP | 2006-523027 | 10/2006 |
| JP | 2006-523029 | 10/2006 |
| JP | 2007-519238 | 7/2007 |
| JP | 2007-525007 | 8/2007 |
| WO | 99/49504 | 9/1999 |
| WO | 03/077036 | 9/2003 |
| WO | 03/077037 | 9/2003 |
| WO | 2004/019128 | 3/2004 |
| WO | 2004/053596 A2 | 6/2004 |
| WO | 2004/053950 A1 | 6/2004 |
| WO | 2004/053951 A1 | 6/2004 |
| WO | 2004/053952 A1 | 6/2004 |
| WO | 2004/053953 A1 | 6/2004 |
| WO | 2004/053954 A1 | 6/2004 |
| WO | 2004/053955 A1 | 6/2004 |
| WO | 2004/053956 A1 | 6/2004 |
| WO | 2004/053957 A1 | 6/2004 |
| WO | 2004/053958 A1 | 6/2004 |
| WO | 2004/053959 A1 | 6/2004 |
| WO | 2004/055803 A1 | 7/2004 |
| WO | 2004/057589 A1 | 7/2004 |
| WO | 2004/057590 A1 | 7/2004 |
| WO | 2004/092830 A2 | 10/2004 |
| WO | 2005/006417 | 1/2005 |
| WO | 2005-024517 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

(56) References Cited

OTHER PUBLICATIONS

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, J. Microlith., Microfab., Microsyst. 1(1):7-12 (2002).

English translation of Japanese Official Action issued on Dec. 2, 2008 in Japanese Application No. 2005-326781.

English translation of JP 2004-259966 (dated Sep. 16, 2004).

Japanese Office Action mailed Aug. 2, 2011 in corresponding Japanese Patent Application No. 2009-048424.

Japanese Office Action mailed Jul. 26, 2012 in corresponding Japanese Patent Application No. 2011-220593.

LITHOGRAPHIC APPARATUS AND DEVICE MANUFACTURING METHOD INVOLVING A LIQUID CONFINEMENT STRUCTURE

The present application is a continuation of U.S. patent application Ser. No. 14/993,810, filed on Jan. 12, 2016, now allowed, which is a continuation of U.S. patent application Ser. No. 14/444,833, filed on Jul. 28, 2014, now U.S. Pat. No. 9,261,797, which is a continuation of U.S. patent application Ser. No. 12/725,883, filed on Mar. 17, 2010, now U.S. Pat. No. 8,817,231, which is a continuation of U.S. patent application Ser. No. 12/213,426, filed on Jun. 19, 2008, now U.S. Pat. No. 7,710,537, which is a continuation application of U.S. patent application Ser. No. 10/986,185, filed Nov. 12, 2004, now U.S. Pat. No. 7,423,720, the entire contents of the foregoing applications is hereby incorporated by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, United States patent U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

In an immersion lithographic apparatus in which the immersion liquid is localized under the projection system, one or more drying stains may be left on the substrate after the liquid supply system has passed. Such drying stains may cause defects in the printed devices and cause other problems for several reasons. The drying stains may affect development of the exposed resist. Drying stains may prevent proper exposure of the underlying resist (drying stains caused during exposure of one target portion or during acceleration and/or deceleration may overlay an adjacent target portion which is exposed later). Particles from drying stains may chemically contaminate the substrate. Particles from drying stains may contaminate other parts of the apparatus.

SUMMARY

Accordingly, it would be advantageous, for example, to provide an immersion lithography apparatus in which the occurrence of one or more drying stains on the substrate is reduced or avoided.

According to an aspect of the invention, there is provided a lithographic projection apparatus arranged to project a pattern from a patterning device onto a substrate through a liquid, the apparatus comprising a liquid confinement structure configured to confine the liquid to a space adjacent the substrate, wherein the space is smaller in plan than the substrate and is substantially polygonal in plan substantially parallel to the substrate.

According to an aspect of the invention, there is provided a lithographic projection apparatus, comprising:
an illuminator configured to condition a radiation beam;
a support constructed to hold a patterning device, the patterning device configured to impart the radiation beam with a pattern in its cross-section to form a patterned radiation beam;
a substrate table constructed to hold a substrate;
a projection system configured to project the patterned radiation beam onto a target portion of the substrate;
a liquid supply system configured to at least partly fill a space between the projection system and the substrate with a liquid, the liquid supply system comprising a liquid confinement structure configured to at least partly confine the liquid within the space, an inner periphery of the liquid confinement structure adjacent the liquid substantially forming a polygon.

According to an aspect of the invention, there is provided a device manufacturing method, comprising:

supplying liquid to a space adjacent a substrate, the space being smaller in plan than the substrate and being substantially polygonal in plan substantially parallel to the substrate; and projecting a patterned beam of radiation through the liquid onto the substrate.

According to an aspect of the invention, there is provided a device manufacturing method, comprising:

at least partly confining a liquid to a space between a projection system of a lithographic apparatus and a substrate using a liquid confinement structure, an inner periphery of the liquid confinement structure adjacent the liquid substantially forming a polygon; and projecting a patterned beam of radiation through the liquid onto the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
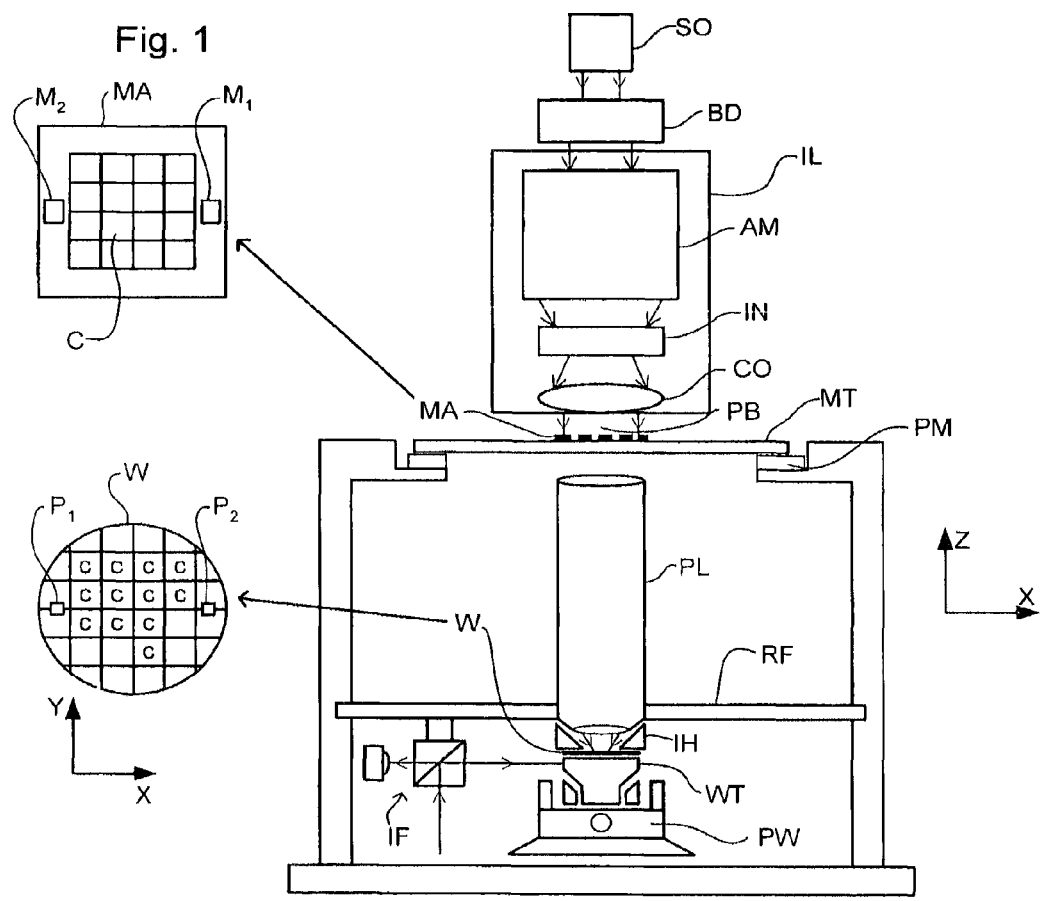
FIG. 1 depicts a lithographic apparatus according to an embodiment of the invention.
Figure 2:
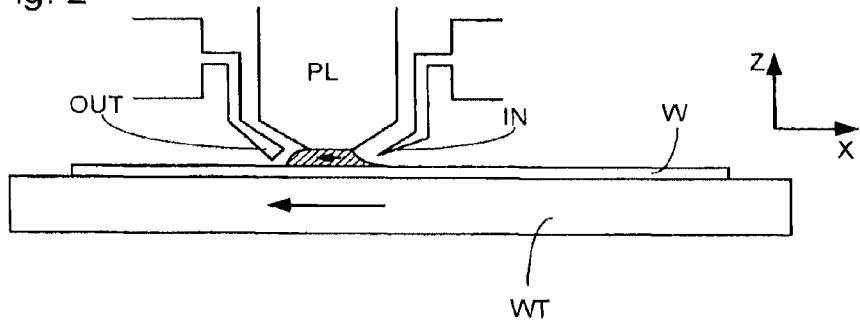
FIGS. 2 and 3 depict a liquid supply system for use in a lithographic projection apparatus.
Figure 3:
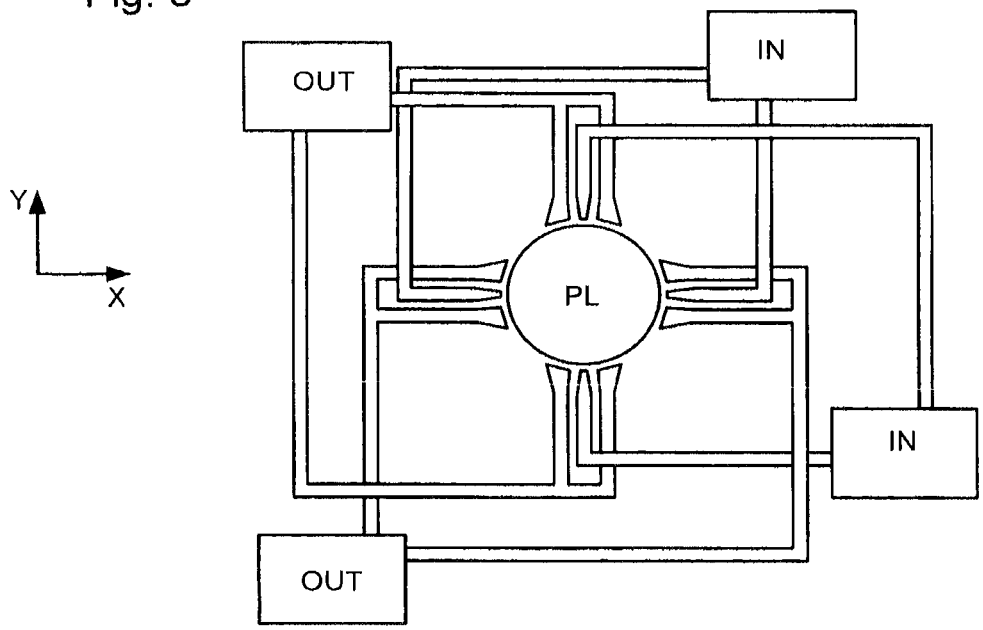

FIG. 1 schematically depicts a lithographic apparatus according to an embodiment of the invention. The apparatus comprises:

an illumination system (illuminator) IL configured to condition a radiation beam PB (e.g. UV radiation or DUV radiation).

a support structure (e.g. a mask table) MT constructed to hold a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
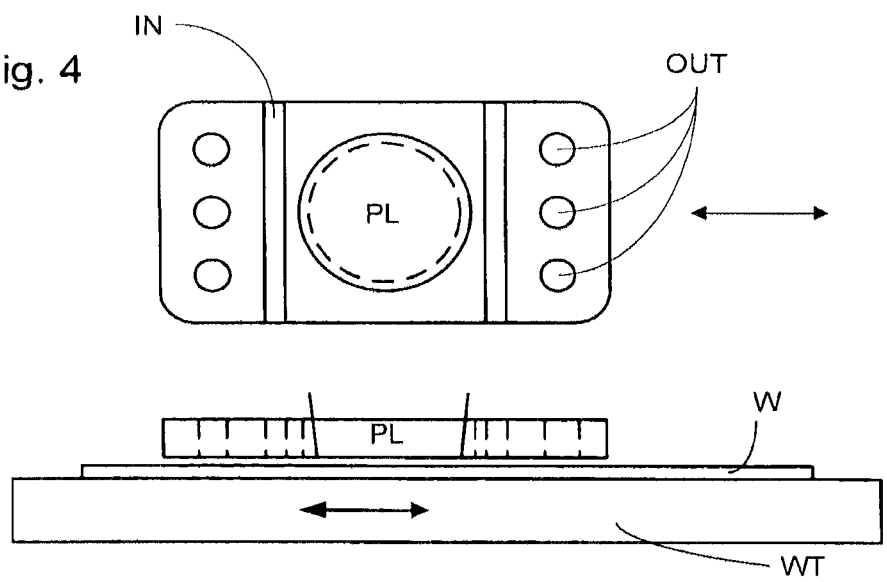
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
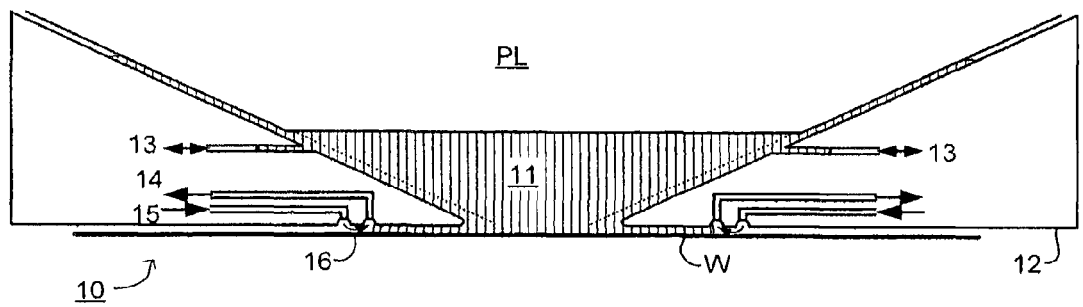
FIG. 5 depicts a further liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a system is shown in FIG. 5. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. patent application Ser. No. 10/705,783, hereby incorporated in its entirety by reference.

FIG. 5 depicts an arrangement of a reservoir 10, which forms a contactless seal to the substrate around the image field of the projection system so that liquid is confined to fill a space between the substrate surface and the final element of the projection system. A liquid confinement structure 12 positioned below and surrounding the final element of the projection system PL forms the reservoir. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and substrate and extracted via first outlet 14. The overpressure on the gas inlet 15, vacuum level on the first outlet 14 and geometry of the gap are arranged so that there is a high-velocity gas flow inwards that confines the liquid. It will be understood by the person skilled in the art that other types of seal could be used to contain the liquid.

Examination of test substrates exposed using an immersion lithography apparatus with a liquid confinement structures having a circular cross-section has revealed that most of the drying stains and particles left on the substrate after exposures have been completed lie in the locus of the side edges of the immersed region. In effect, the showerhead leaves behind two tracks of drying stains and particles as it passes across the substrate. See, e.g., the two tracks depicted in FIG. 6.

Figure 8:
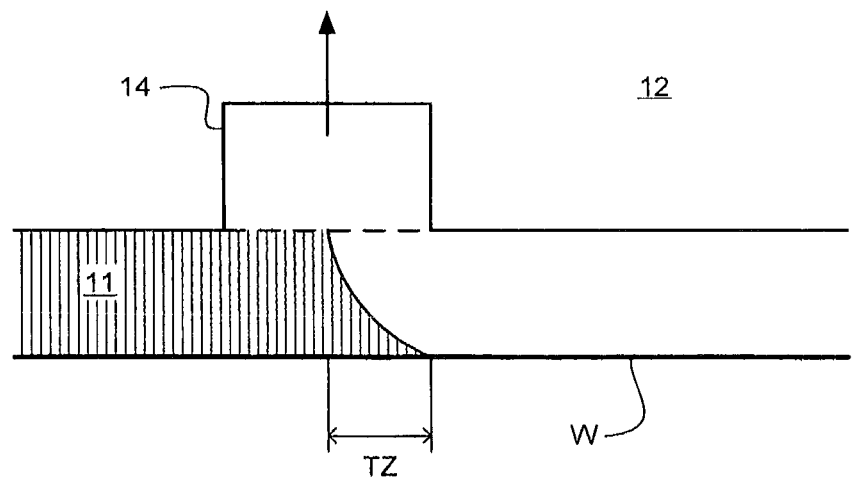
FIG. 8 depicts a transition zone between "wet" and "dry" spaces.

The edges of the immersed space are typically not well defined and there is a transition zone TZ, shown in FIG. 8, between areas that are completely dry and areas that are completely immersed ("wet"). The width of the transition zone will depend on the exact dimensions and type of the liquid confinement system and may be present in all types of liquid supply and/or confinement system, including those described herein. The transition zone may, at a minimum, be the width of the meniscus formed by the immersion liquid but may be wider than this due to turbulence, frothing, etc. in the immersion liquid because of gas flows used to confine the liquid or used to sweep it away, for example.

Figure 6:
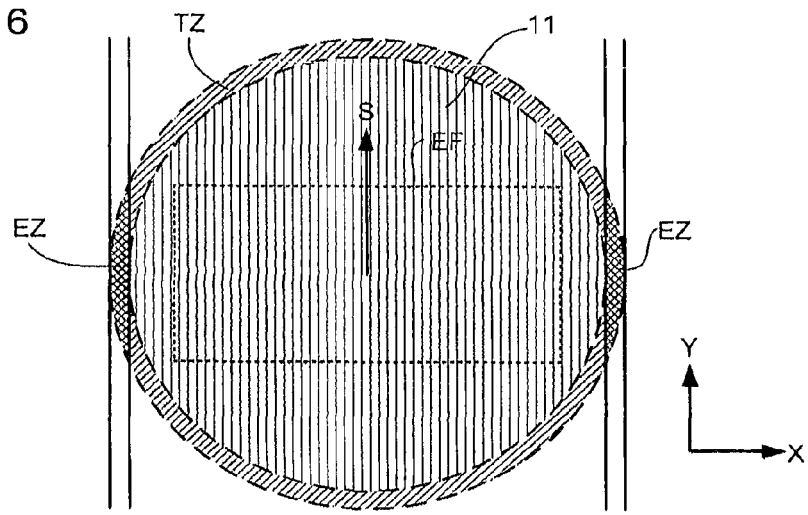
FIG. 6 depicts in plan the liquid supply system of FIG. 5.

In the transition zone, droplets of immersion liquid are continually deposited on the substrate. As shown in FIG. 6, the substrate is scanned relative to the projection system PL and the liquid confinement system in the direction of the arrow S. Droplets deposited on the substrate W in the leading edge of the transition zone will be swept up by the main body of liquid 11. Droplets deposited in the trailing edge of the transition zone TZ will not be, but because the width of the transition zone in this part is small, the time spent by a given point on the substrate in this zone is small and the probability of a droplet being deposited is low. On the other hand, a point on the substrate that is passed over by the edge parts EZ of the transition zone will spend a comparatively long period in this zone and will not subsequently be swept over by the main body of the liquid. Thus, the probability of a droplet being deposited on the substrate and left behind after the liquid confinement system passes is high. Any particulates or dissolved contaminants in the liquid may then result in a drying stain or a deposited particulate when the immersion liquid evaporates.

According to an embodiment of the present invention, to reduce or minimize the occurrence of a drying stain and/or a deposited particulate on the substrate, the liquid confinement system is arranged to confine the liquid to a space that is substantially polygonal in plan, rather than circular. This reduces or minimizes the time spent by a given point in the transition zone. In a specific embodiment, a liquid confinement structure 12 is used to confine the liquid 11 to the space and the liquid confinement structure has an inner periphery of the desired polygonal shape.

Figure 7:
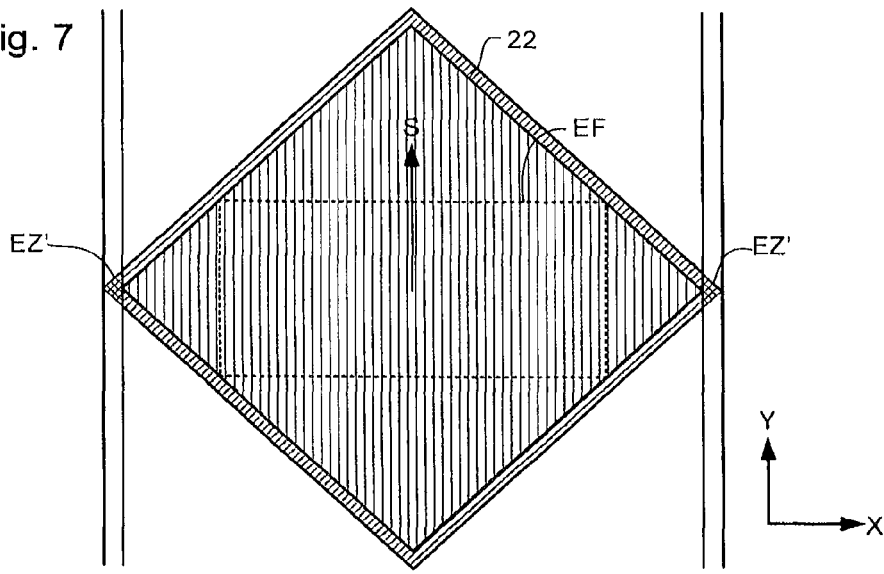
FIG. 7 depicts in plan the liquid supply system of an embodiment of the invention.

As shown in FIG. 7, in an embodiment of the invention, the immersion liquid is confined to a substantially square region 22 oriented with its diagonals substantially parallel to the principal axes X and Y of the substrate stage coordinate system. These principal axes are in effect defined by the paths of measuring beams of the interferometric displacement measuring system IF, which measure displacements of the substrate table. It can be seen that if the substrate and liquid confinement system are relatively moved (e.g., scanned) in directions parallel to the X and/or Y axes, the length of the edge zone EZ' in the direction of motion is reduced/minimized and hence so is the probability of a particle being deposited or a drying stain forming.

Figure 9:
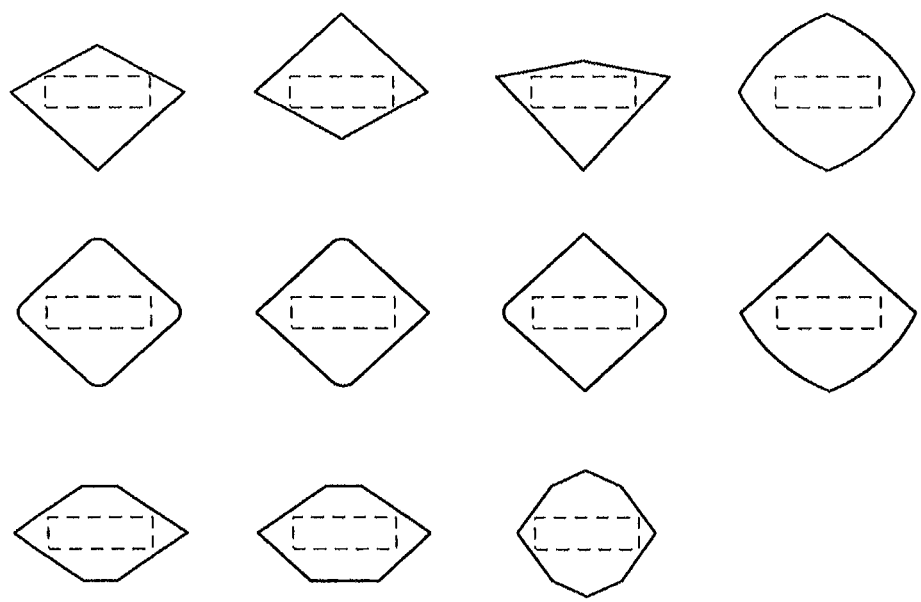
FIG. 9 depicts alternative shapes of the liquid-filled space.

It will be appreciated that the two or more corners of the polygon need not be perfectly sharp. In an embodiment, two corners have a radius of curvature no greater than the width of the transition zone TZ, otherwise the length of the edge zone EZ' is increased. However, benefit may also be obtained with corners of larger radius, e.g. up to four or five times the width of the transition zone. If scanning movements of the substrate will be largely or exclusively in one direction, e.g. the Y direction, the shape of the space 22 need not be symmetrical as shown but could be shortened in the Y direction, so as to form a parallelogram or rhombus. The liquid confinement structure also need not be symmetrical about the X-axis so that a kite-shaped arrangement can be used. Curved, rather than straight edges may also be used. Some possible shapes are shown in FIG. 9. These shapes may further reduce the size of the edge zone EZ. The shape of the space to which the immersion liquid is confined is in principle only restricted by the need to ensure that the exposure field EF is completely covered by immersion liquid and to provide space to extract liquid as necessary.

In European patent application Ser. No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

In an embodiment, there is provided a lithographic projection apparatus arranged to project a pattern from a patterning device onto a substrate through a liquid, the apparatus comprising a liquid confinement structure configured to confine the liquid to a space adjacent the substrate, wherein the space is smaller in plan than the substrate and is substantially polygonal in plan substantially parallel to the substrate.

In an embodiment, two corners of the space have a radius of curvature no greater than a width of a transition zone between the space configured to contain liquid and a surrounding space configured not to have liquid. In an embodiment, the space is a substantially regular polygon in plan. In an embodiment, the space is substantially square in plan. In an embodiment; diagonals of the space are respectively substantially parallel to principal axes of a coordinate system of the apparatus. In an embodiment, the principal axes are defined relative to paths of beams of a measuring system configured to measure displacement of the substrate table.

In an embodiment, there is provided a lithographic projection apparatus, comprising: an illuminator configured to condition a radiation beam; a support constructed to hold a patterning device, the patterning device configured to impart the radiation beam with a pattern in its cross-section to form a patterned radiation beam; a substrate table constructed to hold a substrate; a projection system configured to project the patterned radiation beam onto a target portion of the substrate; and a liquid supply system configured to at least partly fill a space between the projection system and the substrate with a liquid, the liquid supply system comprising a liquid confinement structure configured to at least partly confine the liquid within the space, an inner periphery of the liquid confinement structure adjacent the liquid substantially forming a polygon.

In an embodiment, the space is substantially a regular polygon in plan. In an embodiment, the space is substantially square in plan. In an embodiment, diagonals of the space are respectively substantially parallel to principal axes of a coordinate system of the apparatus. In an embodiment, the principal axes are defined relative to paths of beams of a measuring system configured to measure displacement of the substrate table. In an embodiment, two corners of the inner periphery have a radius of curvature no greater than a width of a transition zone between the space configured to contain liquid and a surrounding space configured not to have liquid.

In an embodiment, there is provided a device manufacturing method, comprising: supplying liquid to a space adjacent a substrate, the space being smaller in plan than the substrate and being substantially polygonal in plan substantially parallel to the substrate; and projecting a patterned beam of radiation through the liquid onto the substrate.

In an embodiment, two corners of the space have a radius of curvature no greater than a width of a transition zone between the space containing liquid and a surrounding space not containing liquid. In an embodiment, the space is a substantially regular polygon in plan. In an embodiment, the space is substantially square in plan. In an embodiment, diagonals of the space are respectively substantially parallel to principal axes of a coordinate system of a lithographic apparatus used to project the patterned beam. In an embodiment, the principal axes are defined relative to paths of beams measuring displacement of a substrate table of the lithographic apparatus holding the substrate.

In an embodiment, there is provided a device manufacturing method, comprising: at least partly confining a liquid to a space between a projection system of a lithographic apparatus and a substrate using a liquid confinement structure, an inner periphery of the liquid confinement structure adjacent the liquid substantially forming a polygon; and projecting a patterned beam of radiation through the liquid onto the substrate.

In an embodiment, the space is substantially a regular polygon in plan. In an embodiment, the space is substantially square in plan. In an embodiment, diagonals of the space are respectively substantially parallel to principal axes of a coordinate system of the lithographic apparatus. In an embodiment, the principal axes are defined relative to paths of beams measuring displacement of a substrate table of the lithographic apparatus holding the substrate. In an embodiment, two corners of the inner periphery have a radius of curvature no greater than a width of a transition zone between the space containing liquid and a surrounding space not containing liquid.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the present invention may be applied to any immersion lithography apparatus, in particular, but not exclusively, to those types mentioned above. A liquid supply system is any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus arranged to project a beam of radiation onto a substrate through a liquid, the apparatus comprising:
   a movable table;
   a liquid confinement structure configured to at least partly confine the liquid to a space adjacent the table such that the liquid extends between a lower surface of the liquid confinement structure and the table, the lower surface having an aperture substantially conforming in shape to an exposure field of the beam of radiation and configured to allow the beam of radiation to pass therethough to the substrate; and
   an outlet configured to remove liquid from between the liquid confinement structure and the table, the outlet being outward, relative to the path of the beam, of the aperture and the outlet arranged in an essentially diamond shape in the horizontal, wherein the shape extends around a path of the radiation beam through the liquid.

2. The apparatus of claim 1, wherein a diagonal of the diamond shape is essentially parallel to either a scanning direction of the table or a stepping direction of the table.

3. The apparatus of claim 2, wherein another diagonal of the diamond shape is essentially parallel to the other of the scanning or stepping direction of the table.

4. The apparatus of claim 1, wherein a plurality of diagonals across the diamond shape pass through the exposure field of the beam of radiation.

5. The apparatus of claim 1, wherein at least two corners of the diamond shape are rounded.

6. The apparatus of claim 1, wherein at least one of the sides of the diamond shape extends at a slant to a scanning or stepping direction of the table.

7. The apparatus of claim 1, wherein the outlet comprises a plurality of openings, the openings arranged in the diamond shape around the path.

8. A liquid confinement structure configured to at least partly confine liquid to a space in a lithographic apparatus adjacent a movable table such that the liquid extends between a lower surface of the liquid confinement structure and the table, the liquid confinement structure comprising:
  an aperture in the lower surface, the aperture having an elongate substantially quadrilateral shape and configured to allow a beam of radiation provided by the lithographic apparatus to pass therethough to the table; and
  an outlet outward, relative to the path of the beam, of the aperture, the outlet configured to remove the liquid from between the liquid confinement structure and the substrate table, the outlet arranged in an elongate multi-sided shape in the horizontal, wherein the shape extends around a path of the radiation beam through the liquid, wherein the multi-sided shape comprises six sides, and wherein a direction of elongation of the quadrilateral shape is essentially parallel to a direction of elongation of the multi-sided shape.

9. The apparatus of claim 8, wherein a plurality of diagonals across the multi-sided shape pass through an exposure field of the beam of radiation.

10. The apparatus of claim 8, wherein the outlet comprises a plurality of openings, the openings arranged in the multi-sided shape around the path.

11. The apparatus of claim 10, wherein at least 4 of the sides of the multi-sided shape extend at a slant to a scanning direction of the table.

12. The apparatus of claim 11, wherein at least 2 of the sides of the multi-sided shape are substantially perpendicular to a scanning direction of the table.

13. The apparatus of claim 8, wherein the multi-sided shape comprises at least two interior angles that are each formed between two adjacent sides of the multi-sided shape and that are each greater than 90 degrees.

14. The apparatus of claim 13, wherein at least one side of the multi-sided shape is a common side for two of the interior angles that are greater than 90 degrees.

15. A lithographic projection apparatus, comprising:
  a substrate table constructed to hold a substrate;
  a projection system configured to project a radiation beam into an exposure field at the substrate;
  a liquid supply system configured to at least partly fill a space between the projection system and the substrate with a liquid;
  a control system configured to cause the substrate table to move in a scanning direction during a projection of the radiation beam onto the substrate; and
  a liquid confinement structure configured to at least partly confine the liquid to a space adjacent the substrate table such that the liquid extends between a lower surface of the liquid confinement structure and the substrate table, the liquid confinement structure comprising:
    an aperture in the lower surface, the aperture having an elongate substantially quadrilateral shape and configured to allow the beam of radiation to pass therethough to the substrate; and
    an outlet outward, relative to the path of the beam, of the aperture, the outlet configured to remove the liquid from between the liquid confinement structure and the substrate table, the outlet arranged in a multi-sided shape in the horizontal, wherein the shape extends around a path of the radiation beam through the liquid and wherein the multi-sided shape comprises at least 4 sides extending at a slant to the scanning direction.

16. The apparatus of claim 15, wherein the multi-sided shape comprises at least two interior angles that are each formed between two adjacent sides of the multi-sided shape and that are each greater than 90 degrees.

17. The apparatus of claim 15, wherein diagonals across the multi-sided shape pass through, and intersect in, the exposure field of the beam of radiation.

18. The apparatus of claim 17, wherein the diagonals are essentially perpendicular to each other.

19. The apparatus of claim 15, wherein at least one side of the multi-sided shape is a common side for two of the interior angles that are greater than 90 degrees.

20. The apparatus of claim 19, wherein the multi-sided shape is elongate in a direction substantially parallel to a direction of elongation of the quadrilateral shape.

21. The apparatus of claim 15, wherein the multi-sided shape is elongate in a direction substantially perpendicular to a direction of elongation of the quadrilateral shape.

* * * * *